(12) United States Patent
Kadoguchi et al.

(10) Patent No.: US 9,711,884 B2
(45) Date of Patent: Jul. 18, 2017

(54) TERMINAL CONNECTION STRUCTURE AND SEMICONDUCTOR APPARATUS

(71) Applicant: Masayoshi Nishihata, Aichi (JP)

(72) Inventors: Takuya Kadoguchi, Toyota (JP); Arata Harada, Gamagoori (JP); Takahiro Hirano, Toyota (JP); Masayoshi Nishihata, Kariya (JP); Keita Fukutani, Kariya (JP); Tomomi Okumura, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/123,145

(22) PCT Filed: Jan. 19, 2015

(86) PCT No.: PCT/JP2015/051227
§ 371 (c)(1),
(2) Date: Sep. 1, 2016

(87) PCT Pub. No.: WO2015/136984
PCT Pub. Date: Sep. 17, 2015

(65) Prior Publication Data
US 2017/0110819 A1    Apr. 20, 2017

(30) Foreign Application Priority Data
Mar. 10, 2014   (JP) ................. 2014-046594

(51) Int. Cl.
*H01R 9/24*    (2006.01)
*H01R 13/03*   (2006.01)
(Continued)

(52) U.S. Cl.
CPC ......... *H01R 13/035* (2013.01); *H01L 23/295* (2013.01); *H01L 23/3114* (2013.01);
(Continued)

(58) Field of Classification Search
CPC ......... H01R 13/04; H01R 43/16; H01R 13/03
(Continued)

(56) References Cited

U.S. PATENT DOCUMENTS 2,537,370 A * 1/1951 Parnes .................. H01R 13/44
                                                     439/693
4,169,646 A * 10/1979 Stape .................. H01R 12/675
                                                     439/395
(Continued)

FOREIGN PATENT DOCUMENTS

JP      2003-171790 A      6/2003
JP      2004-297972 A     10/2004
(Continued)

*Primary Examiner* — Phuongchi T Nguyen
(74) *Attorney, Agent, or Firm* — Oliff PLC

(57) ABSTRACT

A terminal connection structure includes a male terminal; and a female terminal having an elasticity and configured to have the male terminal fitted therein such that the female terminal sandwiches the male terminal from opposite sides; wherein the male includes a base material, a first primary coat coated on the base material, a second primary coat coated on the first primary coat, and a surface layer coated on the second primary coat, and the first primary coat and the second primary coat have different hardnesses.

4 Claims, 6 Drawing Sheets

(51) Int. Cl.
  *H01L 23/31* (2006.01)
  *H01L 23/495* (2006.01)
  *H01L 23/29* (2006.01)
  *H01R 13/11* (2006.01)

(52) U.S. Cl.
  CPC .. *H01L 23/49562* (2013.01); *H01L 23/49568* (2013.01); *H01L 23/49575* (2013.01); *H01L 23/49582* (2013.01); *H01R 13/113* (2013.01)

(58) Field of Classification Search
  USPC .................................................. 439/884–886
  See application file for complete search history.

(56) References Cited

U.S. PATENT DOCUMENTS

| | | | | |
|---|---|---|---|---|
| 7,470,154 | B2* | 12/2008 | Sato | ........................ H01R 13/03 439/693 |
| 8,398,442 | B2* | 3/2013 | Yagi | ........................ H01R 13/04 439/181 |
| 2005/0176267 | A1 | 8/2005 | Saitoh | |

FOREIGN PATENT DOCUMENTS

| | | |
|---|---|---|
| JP | 2005-226089 A | 8/2005 |
| JP | 2006-108057 A | 4/2006 |
| JP | 4302392 B2 | 7/2009 |
| JP | 2010-138452 A | 6/2010 |
| JP | 2010-199622 A | 9/2010 |
| JP | 2011-134522 A | 7/2011 |

\* cited by examiner (a)

(b)

(A)

(B)

(A)

(B)

TERMINAL CONNECTION STRUCTURE AND SEMICONDUCTOR APPARATUS

TECHNICAL FIELD

The disclosure is related to a terminal connection structure, etc.

BACKGROUND ART

A structure is known in which a terminal (male side) for coupling an electronic part to an external device is inserted into a penetrating hole (female side) of a substrate to be coupled to a wiring on the substrate with solder, etc. An example is a semiconductor apparatus in which a terminal for coupling a semiconductor module, which has a semiconductor element covered with resin, to an external device is inserted into a penetrating hole of a substrate to be coupled to a wiring on the substrate with solder, etc., (see, Patent Document 1, for example).

CITATION LIST

[Patent Document 1] Japanese Laid-open Patent Publication No. 2010-199622

SUMMARY

Technical Problem

According to the technique disclosed in Patent Document 1, a process for coupling the terminal to the wiring with the solder, etc., is required, which leads to the increased complexity of a manufacturing process. Thus, instead of coupling the terminal to the wiring with the solder, etc., such a terminal connection structure is preferable in which the terminal of the male side and the terminal of the female side are coupled to each other without the solder, etc. In this case, it is useful to appropriately consider durability of a terminal to design a terminal connection structure.

It is an object of the present disclosure to provide a terminal connection structure, etc., that can increase durability of a terminal.

Solution to Problem

According to one aspect of the disclosure, a terminal connection structure is provided, which includes: a male terminal; and a female terminal having an elasticity and configured to have the male terminal fitted therein such that the female terminal sandwiches the male terminal from opposite sides; wherein the male includes a base material, a first primary coat coated on the base material, a second primary coat coated on the first primary coat, and a surface layer coated on the second primary coat, and the first primary coat and the second primary coat have different hardnesses.

Advantageous Effects of Invention

According to the present disclosure, a terminal connection structure, etc., that can increase durability of a terminal can be obtained.

DESCRIPTION OF EMBODIMENTS

Figure 1:
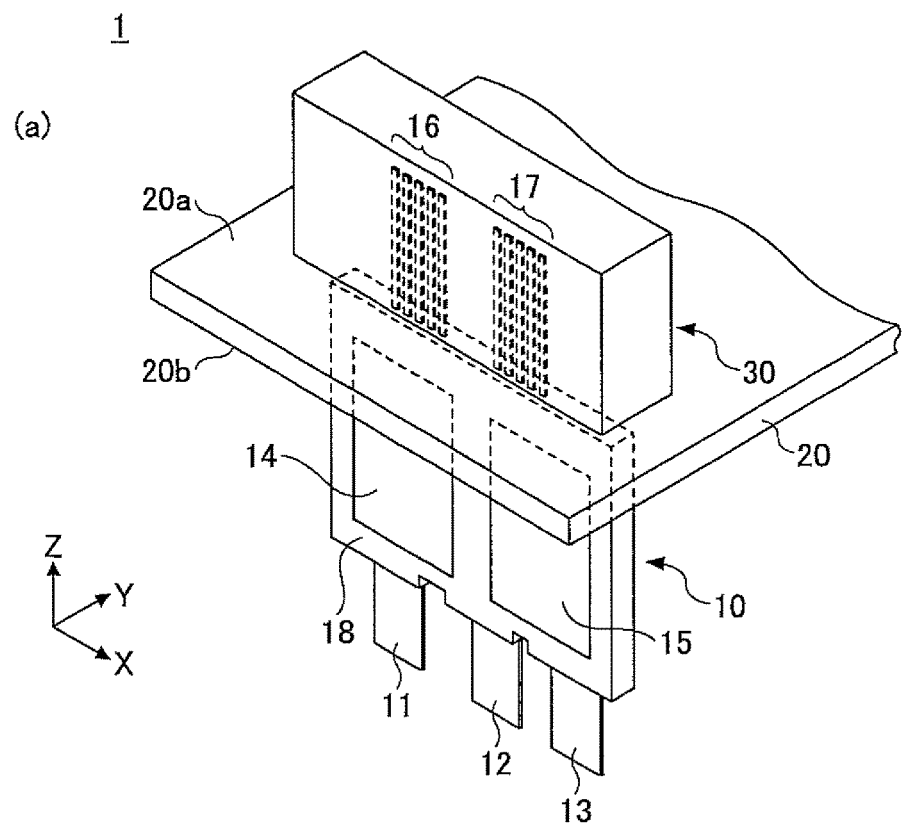
FIG. 1 is a diagram illustrating an example of a semiconductor apparatus according to the first embodiment.
Figure 1:
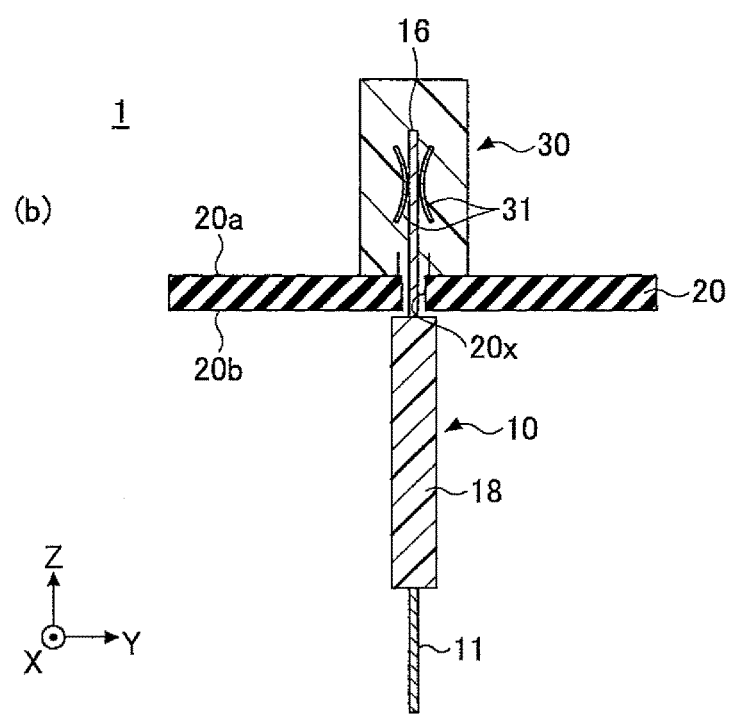

In the following, embodiments are described in detail with reference to appended drawings. In the embodiments, as an example of a terminal connection structure, a semiconductor apparatus in which a male terminal, which is a terminal for coupling a semiconductor module to an external device, is fitted into a female terminal, which is disposed in a connector installed on a substrate, is described; however, this is not indispensable. For example, a female terminal, which is a terminal for coupling an electronic part not including a semiconductor element to an external device, may be fitted into a female terminal, which is disposed in a connector installed on a substrate. Further, a male terminal projecting from a first connector installed in a first substrate may be fitted into a female terminal in a second connector installed on a second substrate. It is noted that in the respective drawings, the same elements are indicated by the same reference numerals, and explanation may be omitted to avoid overlaps.

First Embodiment

FIG. 1 is a diagram illustrating an example of a semiconductor apparatus according to the first embodiment. In FIG. 1, (a) is a perspective view, and (b) is a section-view along a plane through a male terminal 16 (described hereinafter) and parallel to YZ plane of (a). With reference to FIG. 1, a semiconductor apparatus 1 includes a semiconductor module 10, a substrate 20, and a connector 30. According to the semiconductor apparatus 1, male terminals 16 and 17, which are terminals for coupling the semiconductor module 10 to an external device(s), are fitted into female terminals 31 in the connector 30 via the substrate 20.

In the following, the semiconductor apparatus 1 is described in detail. At first, the semiconductor module 10, the substrate 20, and the connector 30 are simply described, and then a structure (i.e., a terminal connection structure) of a portion where the male terminals 16 and 17 of the semiconductor module 10 are fitted into the female terminals 31 of the connector 30 is described in detail.

At first, the semiconductor module 10 is described. The semiconductor module 10 may have any internal structure, as long as the semiconductor module 10 includes a male terminal for an external connection. In the present embodiment, as an example, an semiconductor module including IGBTs (Insulated gate bipolar transistors) and diodes is described.

Figure 2:
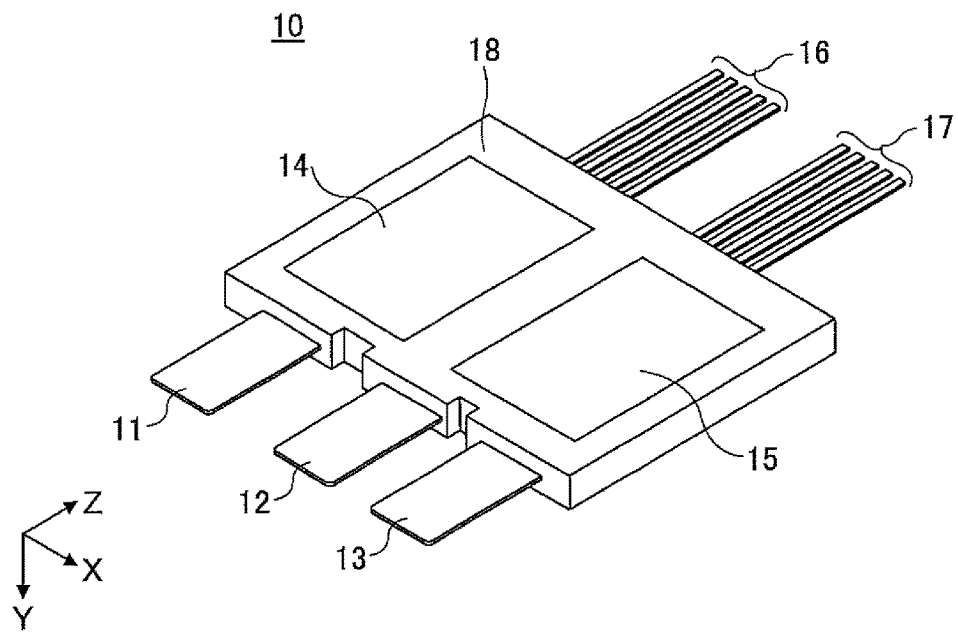
FIG. 2 is a perspective view for illustrating an example of the semiconductor apparatus according to the first embodiment.

FIG. 2 is a perspective view for illustrating an example of the semiconductor apparatus according to the first embodiment. With reference FIG. 1 and FIG. 2, the semiconductor module 10 includes a metal plate 11, a metal plate 12, a metal plate 14, a metal plate 15, a plurality of male terminals 16, a plurality of male terminals 17, and a sealing resin 18.

In the semiconductor module 10, first semiconductor elements (not illustrated) are installed such that the first semiconductor elements are sandwiched between the metal plates 11 and 14. Further, second semiconductor elements (not illustrated) are installed such that the second semiconductor elements are sandwiched between the metal plates 13 and 15.

The metal plates 11, 12, and 13 are electrically coupled to electrodes in one of or both of the first and second semiconductor elements, and can be used as a part of input/output terminals of the first and second semiconductor elements. Further, the metal plates 11 through 15 can radiate heat, which is generated due to operations of the first and second semiconductor elements, to the outside.

The metal plates 11 through 15 may be formed of a copper (Cu), an aluminum (Al), etc., for example. The surfaces of the metal plates 11 through 15 may be plated. The metal plates 11 through 15 may be formed of lead frames, for example.

The first semiconductor elements include IGBTs, and reflux diodes coupled between emitters and collectors of the IGBTs, which are a part of an inverter circuit or a booster converter circuit installed on a vehicle, for example. The second semiconductors element are the same as the first semiconductor elements.

The male terminals 16 are metal terminals for external connection of the semiconductor module 10. The male terminals 16 are electrically coupled to the first semiconductor elements, a temperature sensor, etc., via bonding wires, for example. The male terminals 17 are metal terminals for external connection of the semiconductor module 10. The male terminals 16 are electrically coupled to the second semiconductor elements, a temperature sensor, etc., via bonding wires, for example.

The metal plates 11 through 15, male terminals 16 and 17, and the first and second semiconductor elements are sealed with the sealing resin 18. However, ends of the metal plates 11 through 13 are projected out of the sealing resin 18. Further, predetermined surfaces of the metal plates 14 and 15 are exposed to the outside of the sealing resin 18. Further, ends of the metal plates 16 and 17 are projected out of the sealing resin 18. It is noted that the ends of the metal plates 11 through 13, and the ends of the male terminals 16 and 17 are projected in opposite directions along Z direction. The sealing resin 18 may be formed from an epoxy-based resin having a filler therein, for example.

With reference to FIG. 1, the substrate 20 is a part on which the semiconductor module 10 is installed. The substrate 20 may include a circuit (not illustrated) for driving the semiconductor module 10. The substrate 20 may be a so-called glass epoxy substrate in which glass cloth is impregnated with insulating resin such as epoxy-based resin, etc., a silicon substrate, a ceramic substrate, etc. The substrate 20 may include multi-layered wiring layers.

The substrate 20 has a plurality of penetrating portions 20x formed therein through which the male terminals 16 and 17 of the semiconductor module 10 are inserted. The shape of the penetrating portions 20x in a plan view corresponds to a sectional shape of the male terminals 16 and 17 in a direction perpendicular to the longitudinal direction of the male terminals 16 and 17, and may be rectangular, circular, etc., for example. It is noted that the shape of an object in a plan view corresponds to the shape viewed along a normal direction of a surface 20a of the substrate 20.

The penetrating portions 20x in a plan view are formed such that the size is greater than the sectional size of the male terminals 16 and 17 in a direction perpendicular to the longitudinal direction of the male terminals 16 and 17, so that the male terminals 16 and 17 can be inserted through the penetrating portions 20x. Thus, there are clearances between the internal walls of the penetrating portions 20x and the side surfaces of the male terminals 16 and 17. The penetrating portions 20x may be holes, cutouts, etc., penetrating the substrate 20.

The connector 30 is installed on the surface 20a of the substrate 20. The connector 30 includes the female terminals 31 whose number corresponds to the number of the male terminals 16 and 17. The female terminals 31 can be electrically coupled to the circuit formed on the substrate 20.

The male terminals 16 and 17 of the semiconductor module 10 are inserted to be fitted into the female terminals 31 of the connector 30 from the side of a surface 20b opposite to the surface 20a of the substrate 20. With this arrangement, the first and second semiconductor elements of the semiconductor module 10 can be electrically coupled to the wirings (circuit) formed on the substrate 20 via the male terminals 16, 17 and the female terminals 31 of the connector 30.

It is noted that in the semiconductor apparatus 1 a single semiconductor module 10 is fitted into the connector 30 via the substrate 20; however, a plurality of semiconductor modules 10 may be fitted into corresponding connectors 30 via the substrate 20.

Figure 3:
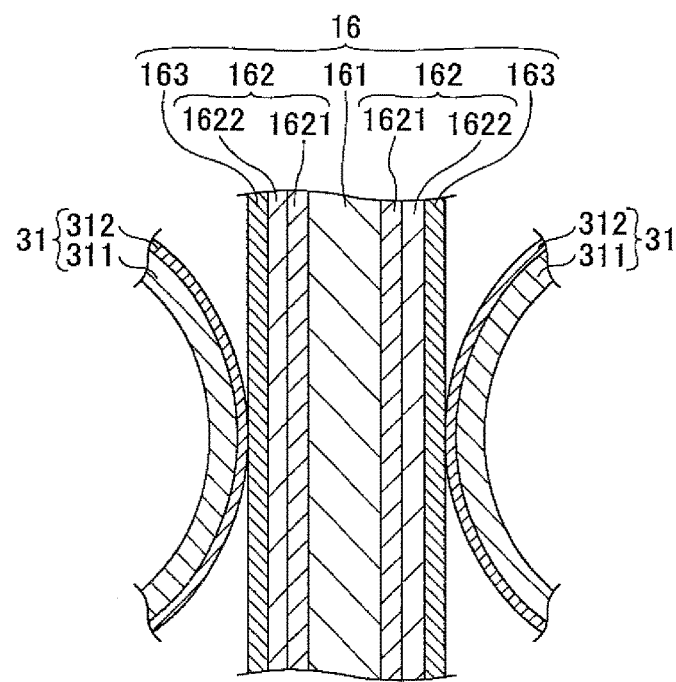
FIG. 3 is a schematic cross-section view of an example of a structure of a portion where a male terminal is fitted into a female terminal.

Next, a structure (i.e., a terminal connection structure) of a portion where the male terminals 16 and 17 of the semiconductor module 10 are fitted into the female terminals 31 of the connector 30 is described in detail. FIG. 3 is a schematic cross-section view of an example of a structure of a portion where a male terminal is fitted into a female terminal, and illustrates an enlarged part of the section-view in FIG. 1 (b). It is noted that the illustration of the female terminals 17 is omitted, but the female terminals 17 have the same structures as the male terminals 16.

With reference FIG. 3, the male terminal includes a metal material 161, which is a base material formed on a center side, a metal film 162 coated on the metal material 161, and a metal film 163, which is coated on the metal film 162 and is a surface treating material formed on an uppermost surface of the male terminal 16. It is noted that a base material is a portion functioning as a base for forming the surface treating material, etc.

For the metal material 161, a metal plate whose main component is a copper (Cu), a copper alloy, aluminum (Al), an aluminum alloy, etc., can be used. The thickness of the metal plate 161 may be 0.2 to 0.8 millimeters, for example. It is noted that the main component is a component whose proportion (weight %) in the member in question is the greatest, if a plurality of metal materials are included in the member in question or an additive, etc., is included in the member in question.

The metal film 162 includes a first primary coat 1621 coated on the metal material 161 and a second primary coat 1622 coated on the first primary coat 1621. Thus, the metal film 163 is coated on the second primary coat 1622. It is noted that the metal film 162 may further include one or more layers in addition to the first primary coat 1621 and the second primary coat 1622.

The first primary coat 1621 has a different hardness (Vickers hardness) with respect to the second primary coat 1622. Specifically, the second primary coat 1622 is harder than the first primary coat 1621. The first primary coat 1621 is formed by Ni electroplating, and the second primary coat 1622 is formed by NiP electroless plating. The hardness of the first primary coat 1621 is preferably in a range between 150 and 500 [HV], and the hardness of the second primary coat 1622 is preferably in a range between 500 and 1000 [HV].

It is noted that according to the present embodiment, the first primary coat 1621 and the second primary coat 1622 are formed of Ni and NiP, respectively; however, other materials may be used. For example, tin (Sn), copper (Cu), silver (Ag), lead (Pb), zinc (Zn), phosphorus (P), boron (B), chrome (Cr), manganese (Mn), iron (Fe), cobalt (Co), palladium (Pd), platinum (Pt), titanium (Ti), zirconium (Zr), vanadium (V), molybdenum (Mo), tungsten (W), indium (In), antimony (Sb), bismuth (Bi), etc., may be used, and a composite such as nickel-boron (NiB), etc., may be used.

For the metal film 163, a metal film whose main component is a noble metal such as gold (Au), platinum (Pt), palladium (Pd), rhodium (Rh), etc., can be used. The thickness of the metal plate 163 may be 0.3 to 0.8 micrometers, for example. The metal film 163 can be formed on the metal film 162 by plating, for example.

The female terminal 31 includes a metal material 311, which is a base material, and a metal film 312, which is coated on the metal material 311 and is a surface treating material formed on an uppermost surface of the female terminal 31.

The female terminal 31 has elasticity. The female terminal 31 has the same structure on opposite sides with respect to the male terminal 16, and uses the elasticity to press the male terminal 16 from the opposite sides. The metal film 312 of the female terminal 31 comes into contact with the metal film 163 of the male terminal 16.

In a state before the insertion of the male terminal 16, the female terminal 31 has two portions opposed to each other such that the metal films 312 of the portions face inwardly (i.e., to the side to come into contact with the male terminal 16) with such a space that enables the male terminal 16 to be inserted therebetween and pressed from the opposite sides by the elasticity thereof. It is noted that the portions of the female terminal 31 on the opposite sides of the male terminal 16 are integrated in the connector 30 to be electrically coupled to each other.

For the metal material 311, a metal plate whose main component is a copper (Cu), a copper alloy, an aluminum (Al), an aluminum alloy, etc., can be used. The thickness of the metal plate 311 may be 0.1 to 0.3 millimeters, for example. It is noted that the metal material 311, which is a base material of the female terminal 31, may have the same or different hardness with respect to the metal material 161, which is a base material of the male terminal 16. For example, the hardness of the metal material 311 and the metal material 161 may be in a range between 40 and 200 [HV].

For the metal film 312, a metal film whose main component is a noble metal such as gold (Au), platinum (Pt), palladium (Pd), rhodium (Rh), etc., can be used. The thickness of the metal plate 312 may be 0.3 to 0.8 micrometers, for example. The metal film 312 can be formed on the metal material 311 by plating, for example. The hardness of the metal film 312 is arbitrary; however, the hardness of the metal film 312 may be the same as that of the metal film 163, for example.

It is noted that the female terminal 31 may include a metal film sandwiched between the metal material 311 and the metal film 312. The material and the thickness of the metal film sandwiched between the metal material 311 and the metal film 312 are arbitrary.

According to the embodiment, as described above, because the first primary coat 1621 and the second primary coat 1622 of the metal film 162 of the male terminal 16 have different hardnesses, durability of the male terminal 16 can be increased even if the semiconductor apparatus 1 is used under a circumstance where the semiconductor apparatus 1 is easily subject to vibration. It is noted that the circumstance where the semiconductor apparatus 1 is easily subject to vibration is such a case where the semiconductor apparatus 1 is installed on a moving object, etc., for example. The moving object is an automobile, a motorcycle, a train, etc., for example.

Figure 4:
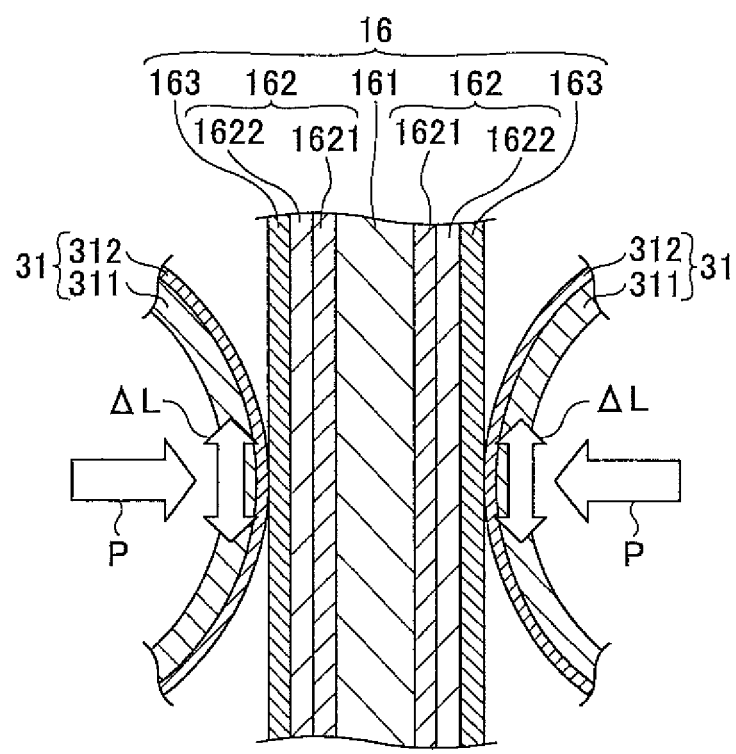
FIG. 4 is a schematic cross-section view explaining an increased durability.

Here, with respect to FIG. 4, the effect of increasing the durability is further described. FIG. 4 schematically illustrates a state in which the male terminal is fitted into the female terminal and used in the circumstance where they are easily subject to vibration. In FIG. 4, the male terminal 16 are pressed by the female terminal 31 at two points from the opposite sides with a contact pressure P. Further, the male terminal 16 and the female terminal 31 are subject to the vibration, which causes the male terminal 16 and the female terminal 31 to relatively slide by a slide distance ΔL.

In this case, when it is assumed that a wear amount is W, a coefficient of friction is K, and Vickers hardness is Hv, a relationship expressed by a formula (1) is held. It is noted that the coefficient of friction K is determined depending on surface roughness of the metal film 163 of the male terminal 16, surface roughness of the metal film 312 of the female terminal 31, a contact area therebetween, etc.

[Math. 1]

$$W \propto k \frac{P}{Hv} \times \Delta L \qquad \text{formula (1)}$$

From the formula (1), it can be understood that the wear amount W can be reduced if the contact pressure is decreased. Further, it can be understood that the wear amount W can be reduced if the slide distance ΔL is decreased. Further, it can be understood that the wear amount W can be reduced if the Vickers hardness Hv is increased.

According to a configuration in which the hardness is merely increased at the sliding portion of the male terminal 16 (for example, a configuration where the first primary coat 1621 is not provided), there is a problem that a crack of the second primary coat 1622 (NiP electroless plating) easily occurs, even though the wear amount W can be reduced. On the other hand, according to a configuration in which the hardness is decreased at the sliding portion of the male terminal 16 (for example, a configuration where the second primary coat 1622 is not provided), the metal film 163 at the uppermost surface, etc., is easily to be worn due to the reduction in the hardness of the slide portion of the male terminal 16, even though the crack can be prevented.

Regarding this point, according to the embodiment, as described above, the sliding portion of the male terminal 16 includes the first primary coat 1621 and the second primary coat 1622, and the first primary coat 1621 is less hard than the second primary coat 1622. Thus, the first primary coat 1621 functions as a stress relieving layer against the contact pressure P, and a probability that the crack of the second primary coat 1622 occurs can be reduced even if the hardness of the second primary coat 1622 is high. Further, the hardness of the male terminal 16 is increased due to the second primary coat 1622, and thus the wear amount W can be reduced even in a circumstance that is easily subject to the vibration. As a result of this, the wear amount W (slide wear amount) of the metal film 163 of the male terminal 16 can be reduced. Thus, according to the embodiment, it becomes possible to keep the contact pressure P with respect to the female terminal 31 greater than or equal to a certain value, while increasing the durability of the male terminal 16.

Figure 5:
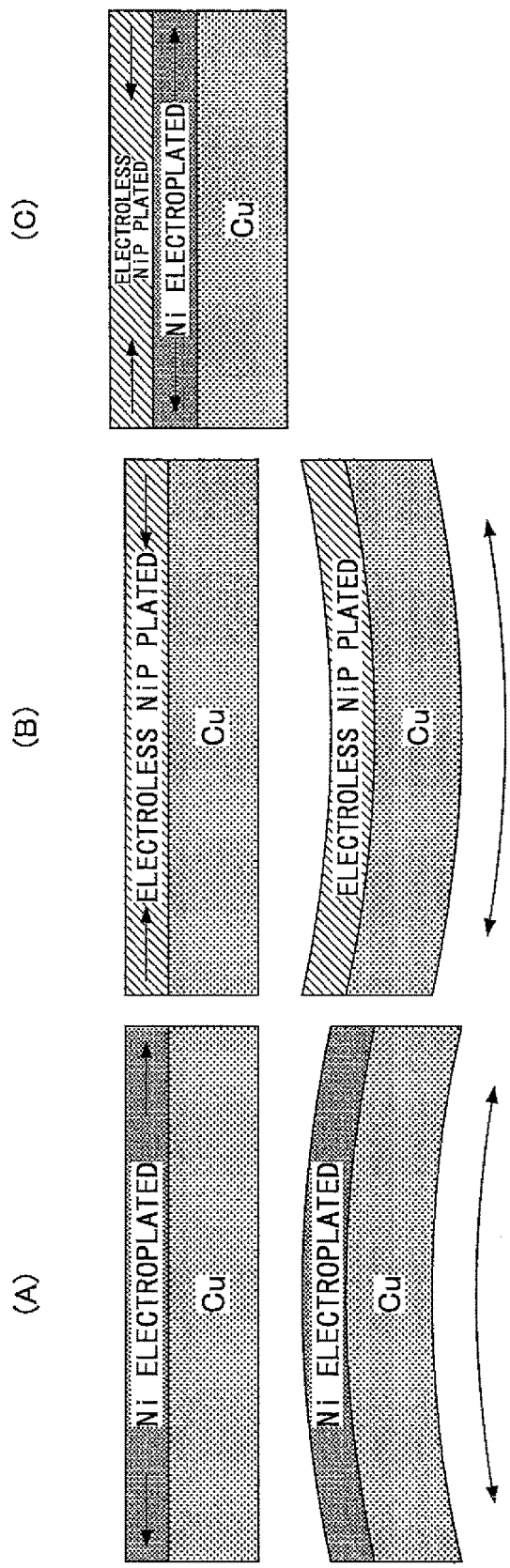
FIG. 5 is a diagram explaining a warping reduction effect in a base material due to a first primary coat 1621 and a second primary coat 1622.

FIG. 5 is a diagram explaining a warping reduction effect in a base material due to the first primary coat 1621 and the second primary coat 1622.

If the Ni electroplating is performed for the base material (Cu), the plated layer is easily subject to a tension stress immediately after the plating, as illustrated in FIG. 5 (A). In this case, the base material tends to warp in such a direction that the base material is in a convex form toward the upper side, as illustrated in FIG. 5 (A). Further, if the electroless NiP plating (P: 7% through 13%) is performed for the base material (Cu), the plated layer is easily subject to a compression stress, as illustrated in FIG. 5 (B). In this case, the base material tends to warp in such a direction that the base material is in a convex form toward the lower side, as illustrated in FIG. 5 (B).

On the other hand, if the Ni electroplating and the electroless NiP plating are performed for the base material (Cu), the warping of the base material can be reduced, because the tension stress of the Ni electroplating layer and the compression stress of the electroless NiP plating layer act in such a direction that the tension stress of the Ni electroplating layer and the compression stress of the electroless NiP plating layer are canceled, as illustrated in FIG. 5 (C). Thus, according to the embodiment, it becomes possible to reduce the warping of the metal material 161 of the male terminal 16, which is a base material, by forming the first primary coat 1621 and the second primary coat 1622.

Further, according to the embodiment, because the second primary coat 1622, which is subject to the compression stress, is a primary coat for the metal film 163, a probability that the crack of the metal film 163 occurs can be reduced, even if the thickness of the second primary coat 1622 and thus residual stress are increased or a thermal stress occurs during the manufacturing process. This is because, in general, material strength is substantially higher against the compression than against the tension.

Further, according to the embodiment, the electroless NiP plating can be performed using the first primary coat 1621 (Ni electroplating) as a seed layer. With this arrangement, the manufacturing process can be further simplified.

Figure 6:
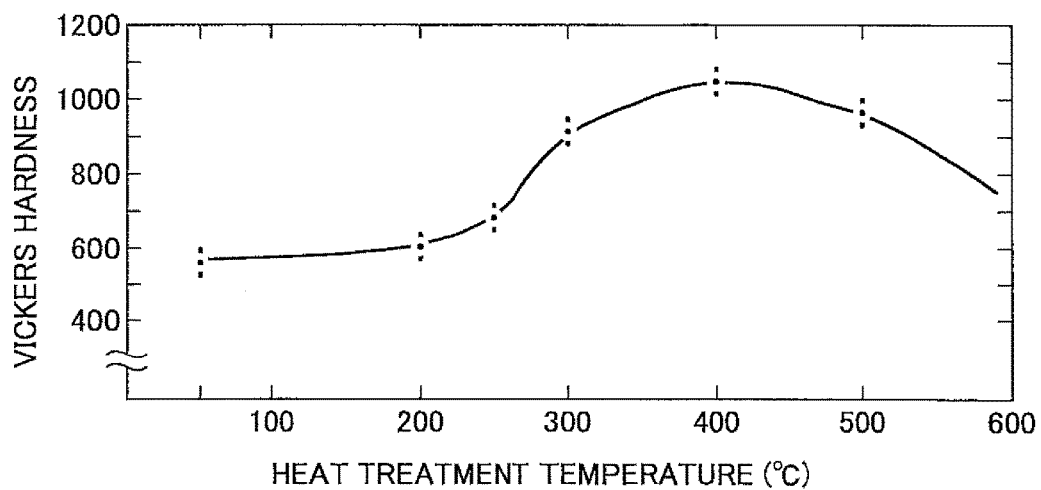
FIG. 6 is a diagram explaining a way of increasing hardness of the second primary coat 1622 (electroless NiP plating).
Figure 6:
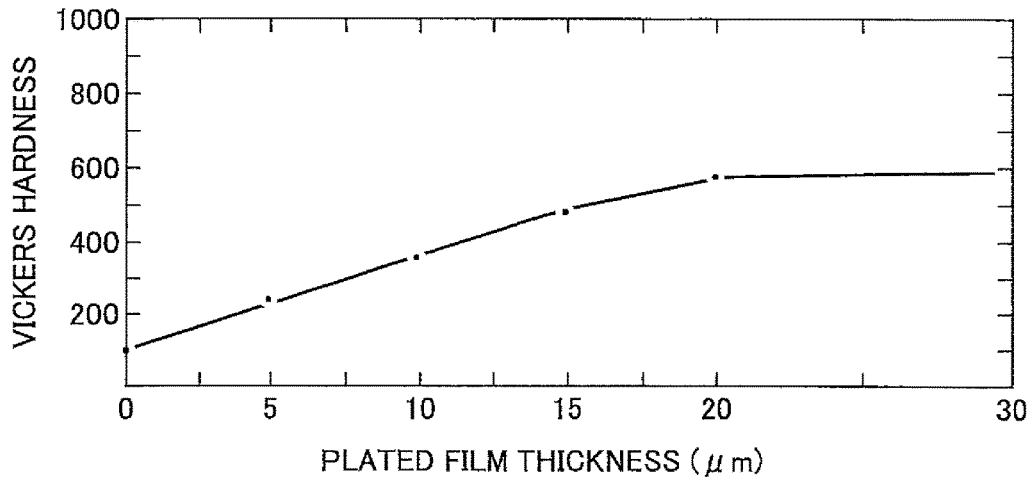
Figure 7:
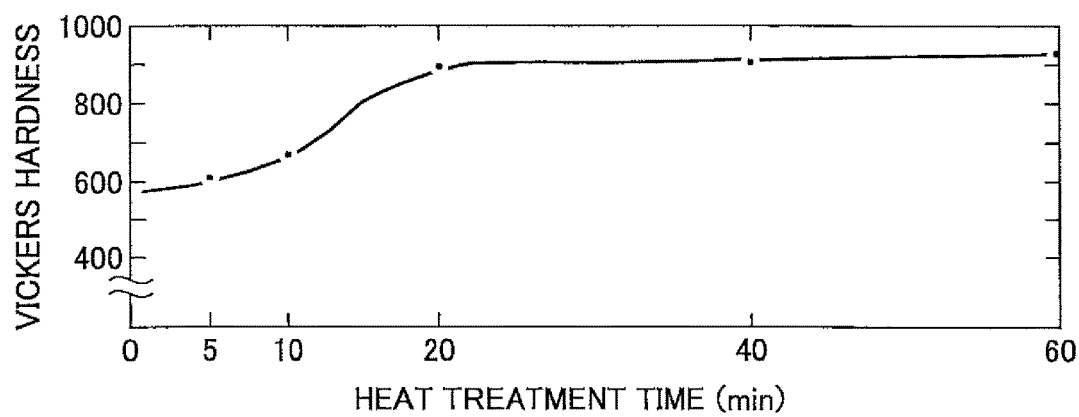
FIG. 7 is a diagram explaining another way of increasing hardness of the second primary coat 1622 (electroless NiP plating).
Figure 7:
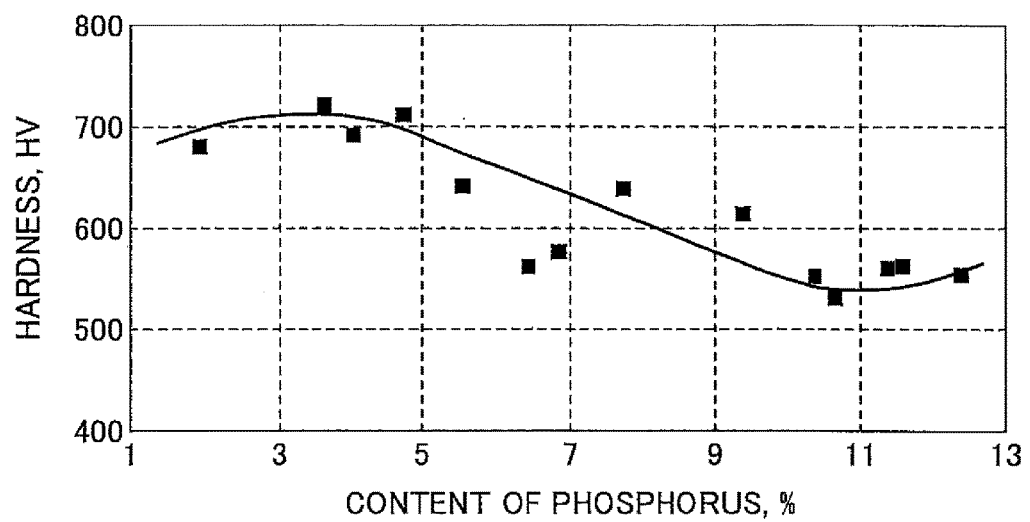

FIG. 6 and FIG. 7 are diagrams explaining a way of increasing the hardness of the second primary coat 1622 (electroless NiP plating).

The hardness of the second primary coat 1622 (electroless NiP plating) may be increased by adjusting a heat treatment temperature, as illustrated in FIG. 6 (A). Further, the hardness of the second primary coat 1622 may be increased by increasing the thickness of the plating, as illustrated in FIG. 6 (B). Further, the hardness of the second primary coat 1622 may be increased by increasing the heat treatment time, as illustrated in FIG. 7 (A). Further, the hardness of the second primary coat 1622 may be increased by adjusting the content of P, as illustrated in FIG. 7 (B).

Variant of First Embodiment

According to a variant of the first embodiment, the first primary coat 1621 has different hardness with respect to the second primary coat 1622, as is the case with the first embodiment. However, according to the variant of the first embodiment, unlike the first embodiment, the first primary coat 1621 is harder than the second primary coat 1622. The second primary coat 1622 is formed by Ni electroplating, and first primary coat 1621 is formed by electroless NiP plating. The hardness of the second primary coat 1622 is preferably in a range between 150 and 500 [HV], and the hardness of the first primary coat 1621 is preferably in a range between 500 and 1000 [HV].

Again, according to the variant of the first embodiment, like the first embodiment, the second primary coat 1622 functions as a stress relieving layer against the contact pressure P, and a probability that the crack of the first primary coat 1621 occurs can be reduced (and thus the durability can be increased) even if the hardness of the first primary coat 1621 is high. Further, the hardness of the male terminal 16 is increased due to the first primary coat 1621, and thus the wear amount W can be reduced even in a circumstance that is easily subject to the vibration. As a result of this, the wear amount W (slide wear amount) of the metal film 163 of the male terminal 16 can be reduced (and thus the durability can be increased).

Further, according to the variant of the first embodiment, like the first embodiment, it becomes possible to reduce the warping of the metal material 161 of the male terminal 16, which is a base material, by forming the first primary coat 1621 and the second primary coat 1622.

Further, according to the variant of the first embodiment, the electroless NiP plating is performed for the lead frame as a whole, and then the Ni electroplating and the Au electroplating can be performed successively and partially for only a contact portion on the uppermost surface. It is noted that, in this case, the Au electroplating forms the metal film 163. With this arrangement, the manufacturing process can be further simplified.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

For example, according to the embodiment and the variant thereof, Vickers hardness is used as an index for explaining the difference of the hardness between the objects; however, indexes other than Vickers hardness may be used to show the difference of the hardness between the objects.

Further, the terminal connection structure according to the embodiment and the variant thereof, a certain effect is obtained when it is used in a circumstance that is easily subject to the vibration; however, needless to say, the terminal connection structure according to the embodiment and the variant thereof may be used in circumstances other than the circumstance that is easily subject to the vibration.

The present international application is based on Japanese Priority Application No. 2014-046594, filed on Mar. 10, 2014, the entire contents of which are hereby incorporated by reference.

DESCRIPTION OF REFERENCE SYMBOLS 1 semiconductor apparatus
10 semiconductor module
11, 12, 13, 14, 15 metal plate
16 male terminal
18 sealing resin
20 substrate
30 connector
31 female terminal
161, 311 metal material
162 metal film
1621 first primary coat
1622 second primary coat
163, 312 metal film
P contact pressure
ΔL slide distance

The invention claimed is:

1. A terminal connection structure, comprising:
a male terminal; and
a female terminal having an elasticity and configured to have the male terminal fitted therein such that the female terminal sandwiches the male terminal from opposite sides, a hardness of the female terminal being different from that of the male terminal; wherein
the male terminal includes a base material, a first primary coat coated on the base material, a second primary coat coated on the first primary coat, and a surface layer coated on the second primary coat,
the first primary coat and the second primary coat have different hardness, and the first primary coat is harder than the second primary coat.

2. The terminal connection structure of claim 1, wherein the first primary coat is an electrodes NiP plating layer, and the second primary coat is a Ni electroplating layer.

3. A terminal connection structure, comprising:
a male terminal; and
a female terminal having an elasticity and configured to have the male terminal fitted therein such that the female terminal sandwiches the male terminal from opposite sides; wherein
the male terminal includes a base material, a first primary coat coated on the base material, a second primary coat coated on the first primary coat, and a surface layer coated on the second primary coat,
the first primary coat and the second primary coat have different hardness, and the second primary coat is an electrodes plating layer, and the first primary coat is an electroplating layer.

4. A semiconductor apparatus including the terminal connection structure of claim 1, wherein the male terminal is a terminal for coupling a semiconductor module to an external device, and the female terminal is a terminal in a connector installed on a substrate.

* * * * *

UNITED STATES PATENT AND TRADEMARK OFFICE
CERTIFICATE OF CORRECTION

PATENT NO. : 9,711,884 B2
APPLICATION NO. : 15/123145
DATED : July 18, 2017
INVENTOR(S) : Takuya Kadoguchi et al.

It is certified that error appears in the above-identified patent and that said Letters Patent is hereby corrected as shown below:

On the Title Page

Item (71) should read as follows:
Takuya KADOGUCHI, Toyota (JP);
Arata HARADA, Gamagoori (JP);
Takahiro HIRANO, Toyota (JP);
Masayoshi NISHIHATA, Kariya (JP);
Keita FUKUTANI, Kariya (JP);
Tomomi OKUMURA, Kariya (JP)

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*